US010186557B2

(12) United States Patent
Ma (10) Patent No.: US 10,186,557 B2
(45) Date of Patent: Jan. 22, 2019

(54) OLED DISPLAY DEVICE, MANUFACTURING METHOD THEREOF, DISPLAY DEVICE AND MASK FOR VAPORIZATION

(71) Applicant: BOE TECHNOLOGY GROUP CO., LTD., Beijing (CN)

(72) Inventor: Lifei Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/762,641

(22) PCT Filed: Oct. 17, 2014

(86) PCT No.: PCT/CN2014/088790
§ 371 (c)(1),
(2) Date: Jul. 22, 2015

(87) PCT Pub. No.: WO2016/004698
PCT Pub. Date: Jan. 14, 2016

(65) Prior Publication Data
US 2016/0276416 A1    Sep. 22, 2016

(30) Foreign Application Priority Data

Jul. 9, 2014   (CN) .......................... 2014 1 0324701

(51) Int. Cl.
*H01L 29/08*      (2006.01)
*H01L 27/32*      (2006.01)
(Continued)

(52) U.S. Cl.
CPC ........ *H01L 27/3218* (2013.01); *C23C 14/042* (2013.01); *C23C 14/12* (2013.01);
(Continued)

(58) Field of Classification Search
CPC .................................................. H01L 27/3218
(Continued)

(56) References Cited

U.S. PATENT DOCUMENTS 8,115,216 B2    2/2012   Smith et al.
8,952,374 B2    2/2015   Jinta et al.
(Continued)

FOREIGN PATENT DOCUMENTS

CN      101449382 A    6/2009
CN      103187432 A    7/2013
(Continued)

OTHER PUBLICATIONS

Chinese Office Action in Chinese Application No. 201410324701.0 dated Jan. 4, 2016 with English translation.
(Continued)

*Primary Examiner* — Ajay K Arora
(74) *Attorney, Agent, or Firm* — Collard & Roe, P.C.

(57)    ABSTRACT

An OLED display device and a manufacturing method thereof, a display device and a vaporization mask are disclosed. Five sub-pixels (101) in a pixel unit (10) of the display device includes at least one red, at least one green and at least one blue sub-pixel. Four of the five sub-pixels (101) are distributed at four corners and have the same shape and size, the other one is surrounded by the four sub-pixels (101), and the four sub-pixels (101) and the one sub-pixel (101) are of different colors. Any one sub-pixel (101) at a corner of the pixel unit (10) forms a regular pattern with one sub-pixel at a corner in each of other three adjacent pixel units (10), and in the regular pattern, all of the sub-pixels are of a same color and each occupies ¼ of the pattern. The display device can reduce the difficulty of manufacturing vaporization openings of a mask and increase the display resolution.

17 Claims, 7 Drawing Sheets

(51) Int. Cl.
    *C23C 14/04*     (2006.01)
    *H01L 51/00*     (2006.01)
    *C23C 14/12*     (2006.01)
    *H01L 51/56*     (2006.01)
    *H01L 51/50*     (2006.01)

(52) U.S. Cl.
    CPC ...... *H01L 27/3216* (2013.01); *H01L 27/3244* (2013.01); *H01L 51/0012* (2013.01); *H01L 51/56* (2013.01); *H01L 51/0011* (2013.01); *H01L 51/50* (2013.01); *H01L 2227/323* (2013.01)

(58) Field of Classification Search
    USPC .......................................................... 257/40
    See application file for complete search history.

(56) References Cited

U.S. PATENT DOCUMENTS

| | | | |
|---|---|---|---|
| 2001/0022565 A1* | 9/2001 | Kimura | G09G 3/3266 345/82 |
| 2002/0015110 A1 | 2/2002 | Brown Elliott | |
| 2004/0095521 A1 | 5/2004 | Song et al. | |
| 2006/0290870 A1 | 12/2006 | Kwak et al. | |
| 2009/0302331 A1* | 12/2009 | Smith | H01L 27/3216 257/88 |
| 2012/0295508 A1 | 11/2012 | Sung et al. | |
| 2013/0002118 A1* | 1/2013 | Ko | H01L 27/3216 313/1 |
| 2013/0105833 A1 | 5/2013 | Weaver et al. | |

FOREIGN PATENT DOCUMENTS

| | | |
|---|---|---|
| CN | 103898441 A | 7/2014 |
| CN | 104037197 A | 9/2014 |
| CN | 204067442 U | 12/2014 |
| CN | 104752469 A | 7/2015 |
| GB | 2 437 110 A | 10/2007 |

OTHER PUBLICATIONS

International Search Report of PCT/CN2014/088790 in Chinese, dated Apr. 20, 2015 with English translation.
Notice of Transmittal of the International Search Report of PCT/CN2014/088790 in Chinese, dated Apr. 20, 2015.
Written Opinion of the International Searching Authority of PCT/CN2014/088790 in Chinese, dated Apr. 20, 2015 with English translation.
Second Chinese Office Action in Chinese Application No. 201410324701.0 dated May 24, 2016 with English translation.
European Search Report in EP 14882154.9 dated Sep. 19, 2017.

* cited by examiner

OLED DISPLAY DEVICE, MANUFACTURING METHOD THEREOF, DISPLAY DEVICE AND MASK FOR VAPORIZATION

CROSS REFERENCE TO RELATED APPLICATIONS

This application is the National Stage of PCT/CN2014/088790 filed on Oct. 17, 2014, which claims priority under 35 U.S.C. § 119 of Chinese Application No. 201410324701.0 filed on Jul. 9, 2014, the disclosure of which is incorporated by reference.

TECHNICAL FIELD

At least one embodiment of the present invention relates to an organic light-emitting diode (OLED) display device, a manufacturing method thereof, a display device and a mask for vaporization.

BACKGROUND

An organic light-emitting diode (OLED) display device is a type of organic thin film electroluminescent device, which has such advantages as easy formation of flexible structures, wide visual angle, and the like. Therefore, the display technology using organic light-emitting diodes has become an important display technology.

An OLED display device that can provide full color display usually is realized by R (red), G (green) and B (blue) sub-pixels illuminating independently, or by white OLEDs in combination with color filters, or the like. The mode in which R, G and B sub-pixels illuminate independently is used most frequently. In this mode, organic luminescent materials in sub-pixel units are used for the independent illumination.

SUMMARY

At least one embodiment of the present invention provides an organic light-emitting diode (OLED) display device and a manufacturing method thereof, a display device and a vaporization mask that can reduce the difficulty of manufacturing vaporization openings of a mask with the same resolution being kept and can address the problem of difficulty in increasing resolution while the minimum accuracy achievable by vaporization openings can be guaranteed.

In one aspect, at least one embodiment of the present invention provides an OLED display device comprising a plurality of pixel units each comprising five sub-pixels comprising at least one red sub-pixel, at least one green sub-pixel and at least one blue sub-pixel; four of the five sub-pixels are distributed at four corners and have a same shape and size, wherein one sub-pixel is surrounded by the four sub-pixels and the four sub-pixels have different colors from the one sub-pixel surrounded by the four sub-pixels; any one sub-pixel at a corner of the pixel unit forms a regular pattern with one sub-pixel at a corner in each of other three adjacent pixel units, and in the regular pattern, all of the sub-pixels are of a same color and each occupies ¼ of the pattern; and the sub-pixels each comprises an anode, a cathode and a light-emitting layer of organic material.

In another aspect, at least one embodiment of the present invention provides a method of manufacturing an OLED display device comprising a plurality of pixel units, which method comprises: on a substrate formed with anodes, forming organic material light-emitting layers in regions of four sub-pixels at four corners and one sub-pixel surrounded by the four sub-pixels in each of the pixel units by vaporization; forming cathodes on the substrate formed with the organic material light-emitting layers; the four sub-pixels at four corners of the pixel unit have a same shape and size; any one sub-pixel at a corner of the pixel unit forms a regular pattern with one sub-pixel at a corner in each of other three adjacent pixel units, and in the regular pattern, all of the sub-pixels are of a same color and each occupies ¼ of the pattern; and the five sub-pixels of the pixel unit comprise at least one red sub-pixel, at least one green sub-pixel and at least one blue sub-pixel, and the four sub-pixels distributed at four corners and the one sub-pixel surrounded by the four sub-pixels are of different colors.

In yet another aspect, at least one embodiment of the present invention provides a vaporization mask for an OLED display device comprising a first mask body and first vaporization openings provided on the first mask body, the first vaporization openings are of a circle or a ellipse shape; the first vaporization openings are arranged in rows and alternatively; in a first direction that passes all centers of circles of the first vaporization openings in any row, a distance between any two adjacent first vaporization openings equals to two times of a diameter of the two vaporization openings in the first direction; and in a second direction that passes all centers of circles of the first vaporization openings in any column, a distance between any two adjacent first vaporization openings equals to two times of a diameter of the two vaporization openings in the second direction.

In yet another aspect, at least one embodiment of the present invention provides a vaporization mask for an OLED display device, comprising: a second mask body and second vaporization openings provided on the second mask body; parts on the mask body other than the second vaporization openings comprise a plurality of blocking areas, each of which is of a circle or ellipse shape, and the second vaporization openings are parts that are separated by the blocking areas; in either a row direction or a column direction, any two adjacent ones of the blocking areas are tangent to each other; and centers of circles of all of the blocking areas in any row or column are in one straight line.

In yet another aspect, at least one embodiment of the present invention provides a display device comprising the above-mentioned OLED display device.

BRIEF DESCRIPTION OF THE DRAWINGS

In order to clearly illustrate the technical solutions of the embodiments of the invention, the drawings of the embodiments will be briefly described in the following; it is obvious that the described drawings are only some embodiments of the invention and thus are not limitative of the invention.

REFERENCE NUMERALS

10—pixel unit; 101—sub-pixel; 101a—first sub-pixel; 101b—second sub-pixel; 101c—third sub-pixel; 102—thin film transistor; 103—anode; 104—organic material light-emitting layer; 105—cathode; 20—first mask body; 201—first vaporization opening; 30—second mask body; 301—second vaporization opening; 302—blocking area.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the embodiments to be described are only some, not all, of the embodiments of the present invention. Based on the described embodiments of the present invention, all other embodiments obtained by those of ordinary skill in the art without any creative effort are within the protection scope of the present invention.

Figure 1:
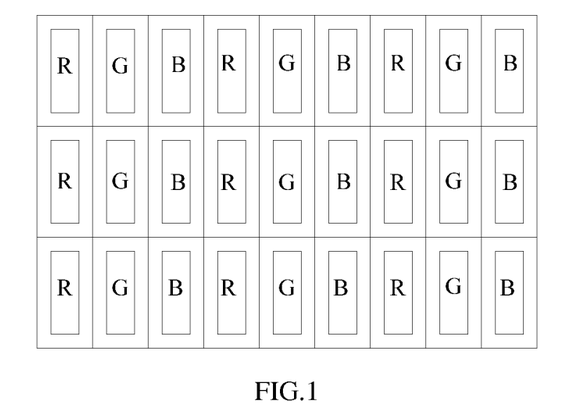
FIG. 1 is a schematic diagram of the arrangement of sub-pixels of each pixel unit in an OLED display device.

The inventor of the present application has noted that, as shown in FIG. 1, R, G and B sub-pixels of an OLED display device are arranged side by side, and a fine metal mask (FMM) technology is commonly used in fabrication, in which the blocking areas of a mask are used to shield two kinds of the R, G and B sub-pixels during the evaporation of organic luminescent material of the rest one, and then the mask or the substrate is moved by means of a high precision aligning system to evaporate the organic luminescent materials of the two kinds of sub-pixels. The sizes of the R, G and B luminescent areas depend on the evaporation openings therefor. However, the evaporation openings are limited physically by the FMM process (e.g., etching process) and thus cannot be arbitrarily small, so that the resolution of the display is limited.

Figure 2:
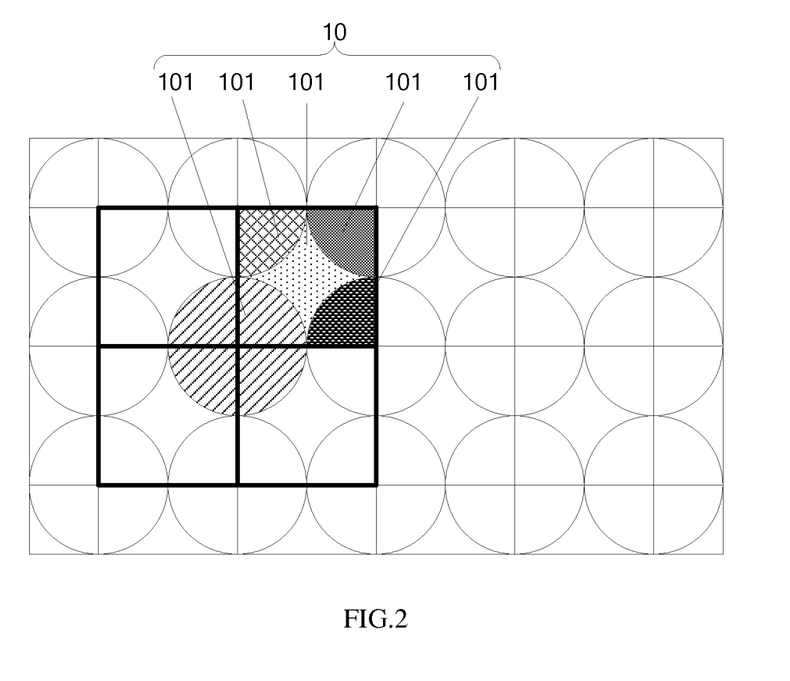
FIG. 2 is a schematic diagram I of the arrangement of sub-pixels of each pixel unit in an OLED display device provided in an embodiment of the present invention.
Figure 3:
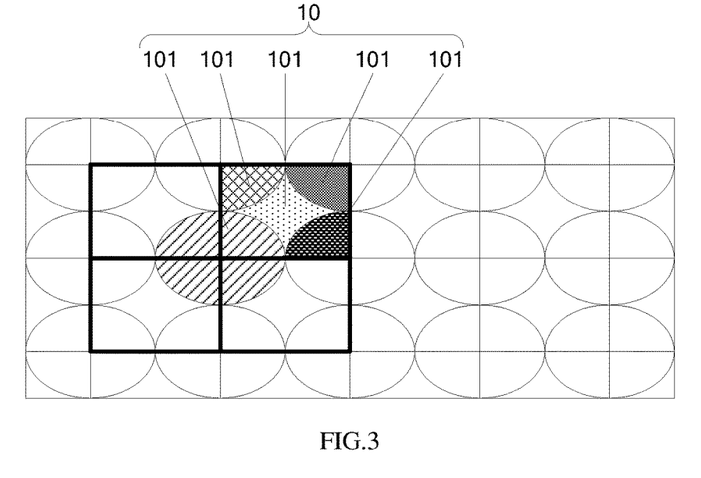
FIG. 3 is a schematic diagram II of the arrangement of sub-pixels of each pixel unit in an OLED display device provided in an embodiment of the present invention.
Figure 4:
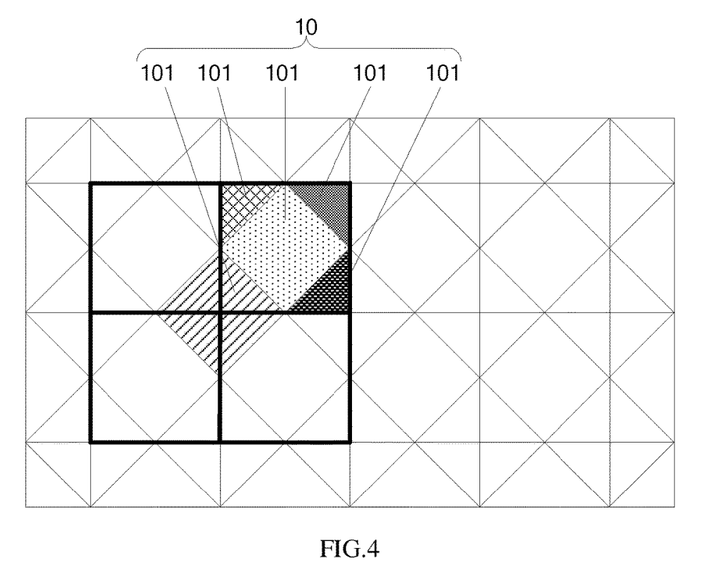
FIG. 4 is a schematic diagram III of the arrangement of sub-pixels of each pixel unit in an OLED display device provided in an embodiment of the present invention.

At least one embodiment of the present invention provides an OLED display device, which, as shown in FIGS. 2-4, comprises a plurality of pixel units 10 each comprising five sub-pixels 101, and the five sub-pixels comprise at least one red sub-pixel, at least one green sub-pixel, and at least one blue sub-pixel. Four of the five sub-pixels 101 are distributed at four corners and have the same shape. One sub-pixel 101 is surrounded by the four sub-pixels 101 and has a different color from those of the four sub-pixels 101. The sub-pixel 101 at any corner of a pixel unit 10 forms a regular pattern together with respective surrounding sub-pixels 101 in three corners of corresponding pixel units 10. In the regular pattern, all the mentioned sub-pixels 101 are of the same color and each make up/occupy ¼ of the pattern. The sub-pixels 101 each comprise an anode, a cathode and an organic material light-emitting layer, which are not shown in FIGS. 2-4.

It is to be noted that, firstly, that the five sub-pixels 101 comprise at least one red sub-pixel, at least one green sub-pixel and at least one blue sub-pixel; for example, the five sub-pixels 101 comprise two red sub-pixels, two green sub-pixels and one blue sub-pixel, or comprise two green sub-pixels, two blue sub-pixels and one red sub-pixel, or comprise two blue sub-pixels, two red sub-pixels and one green sub-pixel, or comprise a white sub-pixel in addition to sub-pixels of the above-mentioned three colors with two of them being in a same color, or comprise two sub-pixels of two other colors in addition to those of the above-mentioned three colors. The arrangement depends on practical considerations and not to be further discussed herein.

Secondly, among the five sub-pixels 101, one is surrounded by the other four distributed at the four corners. That is to say, any side of the one sub-pixel 101 is in contact with one of the other four sub-pixels and each of the other four sub-pixels 101 is in contact with one side of the one sub-pixel 101. Based on this configuration, the four sub-pixels 101 have colors different from that of the one sub-pixel 101 surrounded by them, i.e., regardless of the colors of the four sub-pixels 101 at the four corners, the one sub-pixel 101 that is surrounded has a color that is different from any of the other four sub-pixels 101. Based on this configuration, with respect to the sub-pixel 101 at any corner of a pixel unit 10, because the only three surrounding sub-pixels 101 are located in other respective pixel units 10, the regular pattern formed by those sub-pixels 101 is a closed pattern without any opening, such as the circle filled with oblique lines in FIG. 2, the ellipse filled with oblique lines in FIG. 3, and the diamond filled with oblique lines in FIG. 4, etc.

Thirdly, any one of the sub-pixels 101 illuminates in such a principle that: holes from the anode and electrons from the cathode are both injected into the organic material light-emitting layer, when an operating voltage is applied across the anode and the cathode; the holes and the electrons meet and recombine in the organic material light-emitting layer, so that electron-hole pairs are formed and energy is released; the energy is released in the form of light, which appears in different colors due to the different luminescent molecules in the light-emitting layer, and is emitted from both sides of the organic material light-emitting layers. Therefore, the red sub-pixels in embodiments of the present invention actually indicate that color of the light emitted from their light-emitting layer of organic material is red, and the same rule is applicable to the green sub-pixels and the blue sub-pixels. That is to say, the red sub-pixels, the green sub-pixels and the blue sub-pixels are different in materials of their light-emitting layers of organic material.

Fourthly, an OLED display device can be of a single-side light-emitting type or a double-side light-emitting type, depending on the materials of the anode and the cathode. That is to say, the OLED display device is of a single-side light-emitting type when one of its electrodes is of an opaque material, or a double-side light-emitting type when both of its electrodes are of transparent materials and/or translucent materials. An OLED display device of the single-side light-emitting type can be a top light-emitting one or a bottom light-emitting one. For example, when the anode is disposed close to the substrate and the cathode is disposed away from the substrate, it can be referred to as a bottom light-emitting one if the anode is of a transparent conducting material while the cathode is of an opaque conducting material, leading to the light emitted from the substrate side; or it can be referred to as a top light-emitting one, if the anode is of an opaque conducting material and the cathode is of a transparent or translucent conducting material, leading to the light emitted from the packaging layer side opposite to the substrate side.

Fifthly, accompanying drawings for all the embodiments of the present invention schematically show pattern layers relating to the inventive concept, and do not show or show only parts of pattern layers not relating to the concept.

Embodiments of the present invention provide an OLED display device, which comprises a plurality of pixel units 10 each comprising five sub-pixels 101, and the five sub-pixels comprise at least one red sub-pixel, at least one green sub-pixel, and at least one blue sub-pixel. Four of the five sub-pixels 101 are distributed at four corners and have the same shape and size, one sub-pixels 101 is surrounded by the four sub-pixels 101 and the four sub-pixels 101 have different colors from the one sub-pixel 101 surrounded by the four sub-pixels 101. Any one sub-pixel 101 at a corner of the pixel unit 10 forms a regular pattern with one sub-pixel 101 at a corner in each of other three adjacent pixel units 10, and in the regular pattern, all of the sub-pixels 101 are of the same color and each occupied ¼ of the pattern. The sub-pixel 101 each comprises an anode, a cathode and an organic material light-emitting layer.

Since any one sub-pixel 101 at a corner of the pixel unit 10 forms a regular pattern with one sub-pixel 101 at a corner in each of other three adjacent pixel units 10, and in the regular pattern, all of the sub-pixels 101 are of the same color, it is possible to vaporize the light-emitting layers of organic material of all sub-pixels 101 in the regular pattern at the same time with one and the same vaporization opening. In this way, for sub-pixels 101 in all regular patterns with the same organic material light-emitting layer, they may be vaporized with one mask by allowing its vaporization openings to be in one-to-one correspondence with these regular patterns. Based on this, for vaporizing the organic material light-emitting layer of the one sub-pixel 101 surrounded by the four sub-pixels 101 at corners in any one pixel unit 10, it is only required to have blocking areas of the mask corresponding to the vaporization openings for all of the above-mentioned regular patterns. In this process, it is possible to use a method contrary to the one described above to form vaporization openings without considering size of the one sub-pixel 101.

Based on the above, since it is possible to vaporize light-emitting layers of organic material of four sub-pixels 101 in one regular pattern with one vaporization opening at the same time, on the one hand, the difficulty of processing vaporization openings is reduced while the same resolution as the juxtaposed pixels shown in FIG. 1 is obtained, on the other hand, it is possible to improve resolution while guaranteeing the minimal accuracy achievable for vaporization openings.

Figure 5:
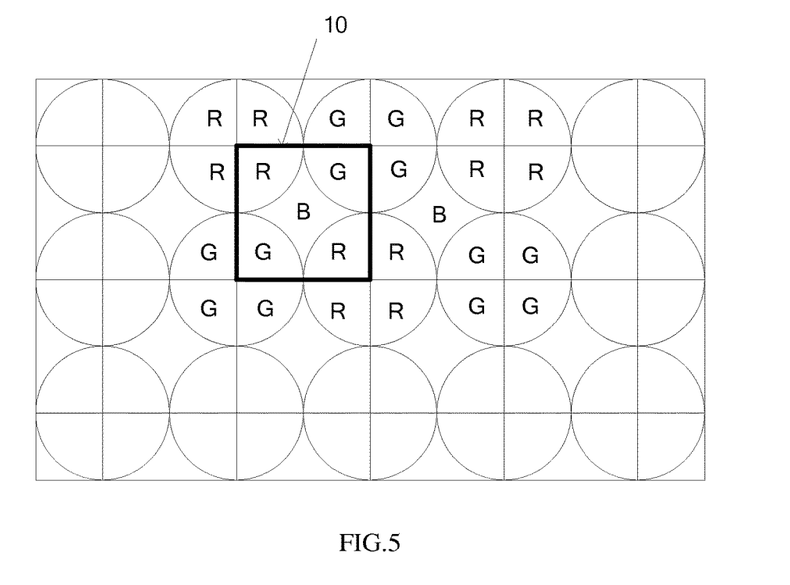
FIG. 5 is a schematic diagram of the arrangement of sub-pixels of various colors in each pixel unit in an OLED display device provided in an embodiment of the present invention.

In one embodiment, as shown in FIG. 5, in the four sub-pixels 101 distributed at four corners of the pixel unit 10, any two opposite sub-pixels 101 are of the same color. Therefore, the five sub-pixels 101 in any one of the pixel units 10 may comprise two red sub-pixels, two green sub-pixels and one blue sub-pixel; or comprise two green sub-pixels, two blue sub-pixels and one red sub-pixel; or comprise two blue sub-pixels, two red sub-pixels and one green sub-pixel. In this way, it is possible to form the light-emitting layers of organic material of two sub-pixels 101 in any one pixel unit 10 by vaporization with one mask at the same time, in which case, the light-emitting layers of organic material of all sub-pixels 101 may be formed by at most three mask processes, namely with at most three masks, which makes the manufacturing process relatively simple and saves the number of masks.

In at least one embodiment, as shown in FIGS. 2 and 3, the regular pattern is a circle or an ellipse. In this way, it is only required to shape the vaporization openings of mask as circles or ellipses to vaporize in all circle or ellipse regions having the same organic material light-emitting layer, thereby in the sub-pixel of a color of each pixel unit 10 forming the light-emitting layer of an organic material corresponding to the color of the sub-pixel. In this process, because one vaporization opening corresponds to four (4) sub-pixels 101, the difficulty of manufacturing vaporization openings of mask is reduced, that is, the vaporization openings may be manufactured relatively large.

Alternatively, as shown in FIG. 4, the regular pattern is a diamond. In this way, it is only required to shape the vaporization openings of mask as diamonds to vaporize in all diamond regions having the same organic material light-emitting layer, thereby in a sub-pixel of a color of each pixel unit 10 forming the light-emitting layer of an organic material corresponding to the color of the sub-pixel. In this process, since one vaporization opening corresponds to four (4) sub-pixels, the difficulty of manufacturing vaporization openings of mask is reduced, that is, the vaporization openings may be manufactured relatively large.

Figure 6:
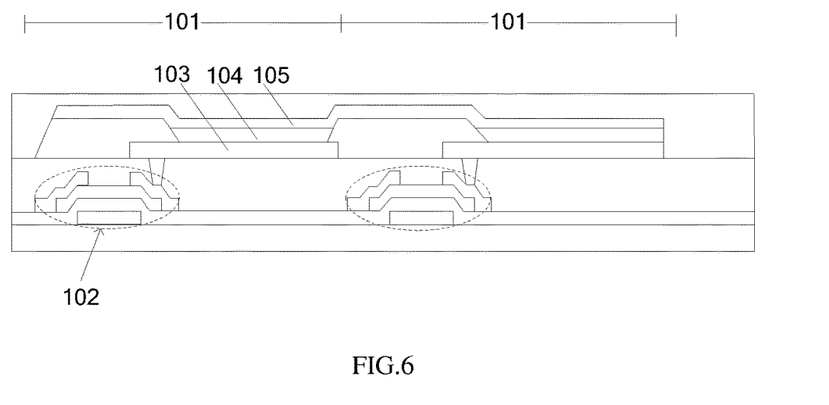
FIG. 6 is a structure diagram of an OLED display device comprising thin film transistors provided in an embodiment of the present invention.

Base on the above, considering that passive matrix type driving has its insufficient aspect in application to large size displays, the OLED display device provided in at least one embodiment of the present invention may be of an active matrix type OLED display device, that is, as shown in FIG. 6, each sub-pixel 101 of the OLED display device may further comprise a thin film transistor 102, and the thin film transistor 102 has its drain electrically connected with the anode 103. In FIG. 6, the organic material light-emitting layer 104 and the cathode 105 are located in order over the anode 103.

The thin film transistor comprises a gate electrode, a gate insulating layer, a semiconductor active layer, a source electrode and a drain electrode. Based on this, the OLED display device further comprises gate lines electrically connected with the gate electrodes, gate line leads (not shown in the figure) and son on, and comprises data lines electrically connected with the source electrodes, data line leads (not shown in the figure), and so on.

It is to be noted that the thin film transistor 102 may be of top-gate type or bottom-gate type. Furthermore, considering that a bottom emitting OLED display device would have a light-emitting area impacted by the thin film transistors, in at least one embodiment of the present invention, the OLED display device is of a top emitting type.

At least one embodiment of the present invention further provides a method of manufacturing OLED display device comprising a plurality of pixel units 10, comprising the following steps S101 to S103. These steps will be described in detail below.

In step S101, an anode 103 is formed in a sub-pixel 101 region of each pixel unit 10 on the substrate.

In this step, each pixel unit 10 comprises five sub-pixels 101, of which four are at corners and the other is surrounded by the four sub-pixels 101 at corners, and the four sub-pixels 101 at the corners have the same shape and size.

The five sub-pixels comprise at least one red sub-pixel, at least one green sub-pixel and at least one blue sub-pixel, and the four sub-pixels distributed at four corners and the one sub-pixel 101 surrounded by the four sub-pixels 101 are of different colors.

Further, any one sub-pixel 101 at a corner of the pixel unit 10 forms a regular pattern with one sub-pixel 101 at a corner in each of other three adjacent pixel units 10, and in the regular pattern, all of the sub-pixels 101 are of the same color and each occupied ¼ of the pattern.

Here, the substrate may be a base substrate, or may be a substrate with a corresponding pattern layer such as thin film transistors 102 formed on a base substrate.

In step S102, on the substrate formed with the anodes 103, an organic material light-emitting layers 104 are formed in regions of four sub-pixels 101 at four corners and one sub-pixel 101 surrounded by the four sub-pixels 101 in each of the pixel units 10 by vaporization.

In this step, since the sub-pixel 101 at any one corner of the pixel unit 10 forms a regular pattern with one sub-pixel 101 at a corner in each of other three adjacent pixel units 10, and in the regular pattern, all of the sub-pixels 101 are of the same color, it is possible to vaporize the organic material light-emitting layers 104 of all sub-pixels 101 in the regular pattern with one and the same vaporization opening.

It is to be noted that, according to the different materials for organic material light-emitting layers of different color sub-pixels at corners, only organic material light-emitting layers of the same kind in sub-pixels 101 of all regular patterns are vaporized at the same time.

Similarly, the one sub-pixel 101 surrounded by the four sub-pixels 101 at corners needs to be vaporized with a separate vaporization process.

In Step 103, cathodes 105 are formed on the substrate formed with the organic material light-emitting layers 104.

An embodiment of the present invention provides a method of manufacturing OLED display device comprising a plurality of pixel units 10. The method comprises: on the substrate formed with the anodes 103, forming an organic material light-emitting layers 104 in regions of four sub-pixels 101 at four corners and one sub-pixel 101 surrounded by the four sub-pixels 101 in each of the pixel units 10 by vaporization; Forming cathodes 105 on the substrate formed with the organic material light-emitting layers 104; the four sub-pixels 101 at four corners of the pixel unit 10 have the same shape and size; any one sub-pixel 101 at a corner of the pixel unit 10 forms a regular pattern with one sub-pixel 101 at a corner in each of other three adjacent pixel units 10, and in the regular pattern, all of the sub-pixels 101 are of the same color and each occupied ¼ of the pattern; the five sub-pixels 101 of the pixel unit 10 comprise at least one red sub-pixel, at least one green sub-pixel and at least one blue sub-pixel, and the four sub-pixels distributed at four corners and the one sub-pixel 101 surrounded by the four sub-pixels 101 are of different colors.

Since any one sub-pixel 101 at a corner of the pixel unit 10 forms a regular pattern with one sub-pixel 101 at a corner in each of other three adjacent pixel units 10, and in the regular pattern, all of the sub-pixels 101 are of the same color, it is possible to vaporize the light-emitting layers of organic material of all sub-pixels 101 in the regular pattern at the same time with one and the same vaporization opening. Based on this, for sub-pixels 101 in all regular patterns with the same organic material light-emitting layer 104, they may be vaporized with one mask by allowing its vaporization openings to be in one-to-one correspondence with these regular patterns. Based on this, for vaporizing the organic material light-emitting layer 104 of the one sub-pixel 101 surrounded by the four sub-pixels 101 at corners in any one pixel unit 10, it is only required to have blocking areas of the mask correspond to the vaporization openings for all of the above-mentioned regular patterns. In this process, it is possible to use a method contrary to the one described above to form vaporization openings without considering size of the one sub-pixel 101.

Based on the above, since it is possible to vaporize organic material light-emitting layers 104 of four sub-pixels 101 in one regular pattern with one vaporization opening at the same time, on the one hand, the difficulty of processing vaporization openings is reduced while the same resolution as the juxtaposed pixels shown in FIG. 1 is obtained, and on the other hand, it is possible to improve resolution while guaranteeing the minimal accuracy achievable for vaporization openings.

In one embodiment, in the four sub-pixels 101 at four corners of the pixel unit 10, any two opposite sub-pixels 101 have organic material light-emitting layers 104 of the same material. Therefore, the five sub-pixels in any one of the pixel units 10 may comprise two red sub-pixels, two green sub-pixels and one blue sub-pixel; or comprise two green sub-pixels, two blue sub-pixels and one red sub-pixel; or comprise two blue sub-pixels, two red sub-pixels and one green sub-pixel. In this way, it is possible to form the organic material light-emitting layers 104 of two sub-pixels 101 in any one pixel unit 10 by vaporization with one mask at the same time, in which case, the organic material light-emitting layers 104 of all sub-pixels 101 may be formed by at most three mask processes, namely with at most three masks, which makes the manufacturing process relatively simple and saves the number of mask.

Based on this, for example, S102 may be implemented in the way of steps S201 to S203 in the following, which will be described in detail here.

Figure 7:
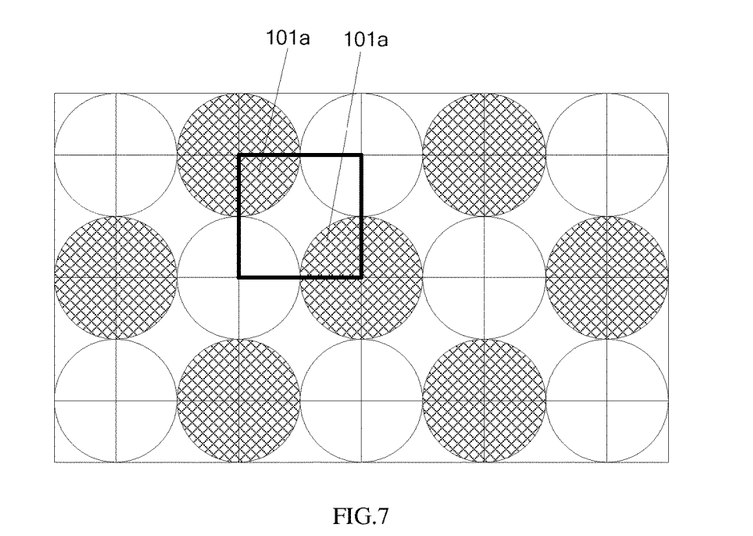
FIGS. 7-9 are schematic diagrams of the process of manufacturing sub-pixels of various colors of an OLED display device provided in an embodiment of the present invention.

In S201, as shown in FIG. 7, on the substrate formed with the anodes 103, it is possible to align the first vaporization opening of the first mask with the first sub-pixel 101a at any corner of the pixel unit 10 and each of sub-pixels 101 in the other three corners of the pixel unit 10 surrounding the first sub-pixel 101a to vaporize the first organic material light-emitting layer.

The first sub-pixel 101a is the sub-pixel 101 at an opposite corner of the pixel unit 10. Here, the first sub-pixel 101a may be for example a red sub-pixel.

Figure 8:
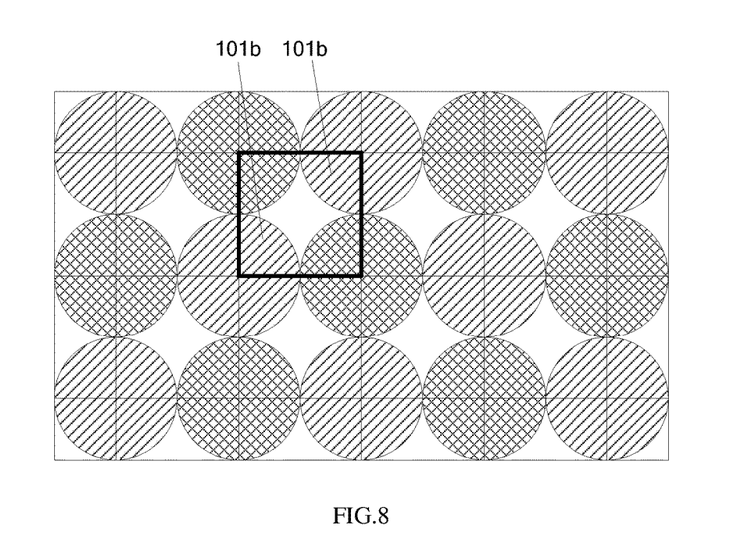

In step S202, as shown in FIG. 8, the first mask is moved to align the first vaporization opening with the second sub-pixel 101b in any one corner of the pixel unit 10 and each of sub-pixels 101 in the other three corners of the pixel unit 10 surrounding the second sub-pixel 101b to vaporize the second organic material light-emitting layer.

The second sub-pixel 101b is the sub-pixel 101 other than the first sub-pixel 101a in the pixel unit 10 that is at an opposite corner. Here, the second sub-pixel 101b may be for example a green sub-pixel.

Figure 9:
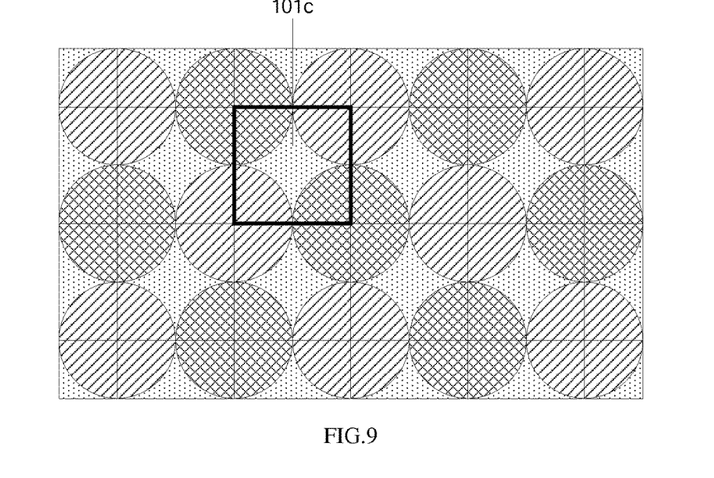

In step S203, as shown in FIG. 9, it is possible to align the second vaporization opening of the second mask with a third sub-pixel 101c surrounded by the first sub-pixel 101a and the second sub-pixel 101b in any of the pixel units 10 to vaporize the third organic material light-emitting layer. Here, the third sub-pixel 101c may be for example a blue sub-pixel.

It is to be noted that the order of the above-mentioned three steps is not limited. Further, the above-mentioned embodiments are described with respect to only an example in which the first, second and third sub-pixels are red, green and blue sub-pixels respectively. However, embodiments of the present invention are not limited thereto. In at least one embodiment, the first sub-pixel, second sub-pixel and third sub-pixel may be red, green and blue sub-pixels with respect to each other, that is, colors of first, second and third sub-pixel may be any combination of red, green and blue, for example, red-blue-green, green-red-blue, blue-red-green etc.

In at least one embodiment, the first vaporization opening is of a circle or ellipse shape. Alternatively, the first vaporization opening is of a diamond shape.

Base on the above, considering that passive matrix driving has its insufficient aspect in application to large size displays, the OLED display device provided in at least one embodiment of the present invention may be an active matrix type OLED display device, that is, as shown in FIG. 6, the method may further comprise forming a thin film transistor 102 in each sub-pixel 101, and the thin film transistor 102 has its drain electrode electrically connected with the anode 103. In FIG. 6, the organic material light-emitting layer 104 and the cathode 105 are located in order over the anode 103.

At least one embodiment of the present invention further provides a vaporization mask for OLED display device, with which it is possible to vaporize the first organic material light-emitting layer located in for example the above-mentioned first sub-pixel 101a area, and of course it is possible to vaporize the second organic material light-emitting layer located in for example the above-mentioned second sub-pixel 101b area.

Figure 10A:
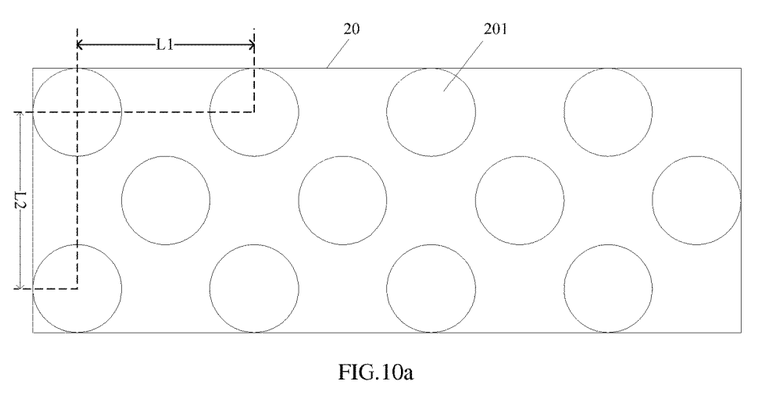
FIG. 10a is a structure diagram I of a mask for vaporizing OLED display devices provided in an embodiment of the present invention.
Figure 10B:
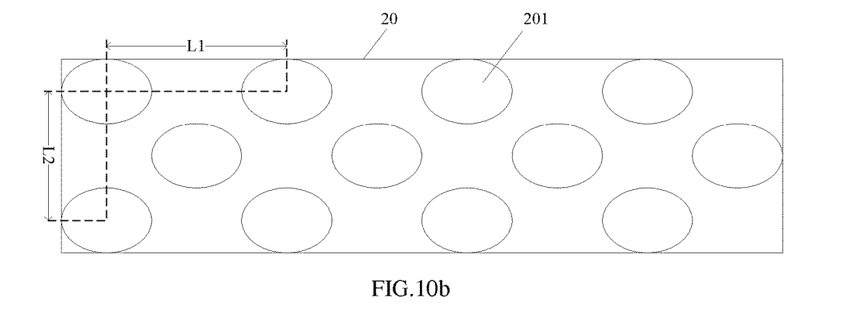
FIG. 10b is a structure diagram II of a mask for vaporizing OLED display devices provided in an embodiment of the present invention.

As shown in FIG. 10a or FIG. 10b, the mask comprises a first mask body 20 and first vaporization openings 201 provided on the first mask body 20, which are of a circle or ellipse shape.

For example, the first vaporization openings 201 are arranged in rows and separated. In a first direction that passes all the centers of the circles of the first vaporization openings 201 in any row, the distance L1 between any two adjacent first vaporization openings 201 equals to two times of the diameter of the two vaporization openings 201 in the first direction. In a second direction that passes all the centers of the circles of the first vaporization openings 201 in any column, the distance L2 between any two adjacent first vaporization openings 201 equals to two times of the diameter of the two vaporization openings 201 in the second direction.

In this way, it is possible to vaporize corresponding organic material light-emitting layers by simply using the mask and having its first vaporization openings 201 to be aligned, in one-to-one correspondence, with regular patterns, each of which is formed by any one of the sub-pixels 101 at corners of a pixel unit 10 and three surrounding sub-pixels 101 in the corners of other three adjacent pixel units 10.

With the mask provided in the embodiment of the present invention, on the one hand, it reduces the difficulty of processing vaporization openings while the same resolution as the juxtaposed pixels shown in FIG. 1 can be obtained, and on the other hand, it may increase resolution while the minimum accuracy achievable by vaporization openings can be guaranteed.

At least one embodiment of the present invention further provides another vaporization mask of OLED display device, with which it is possible to vaporize the third organic material light-emitting layer located over, e.g., the above-mentioned third sub-pixels 101c areas.

Figure 11A:
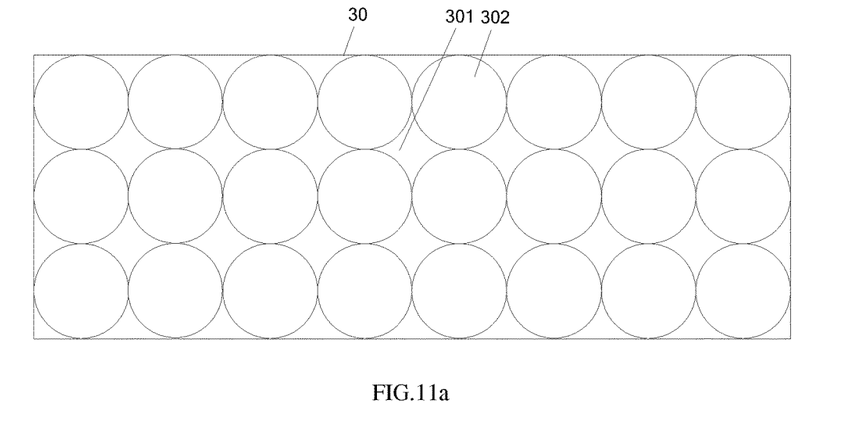
FIG. 11a is a structure diagram III of a mask for vaporizing OLED display devices provided in an embodiment of the present invention.
Figure 11B:
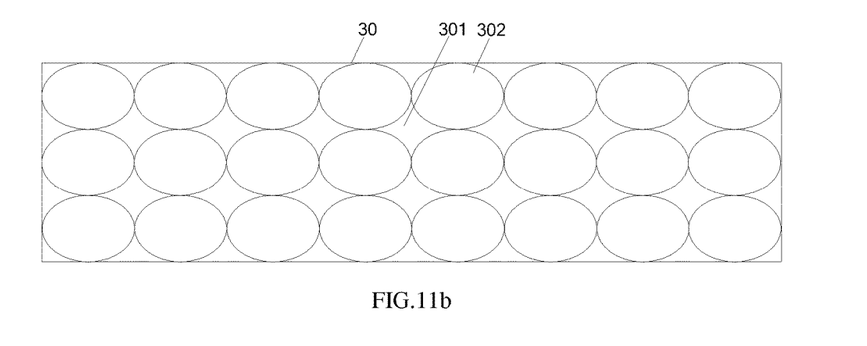
FIG. 11b is a structure diagram IV of a mask for vaporizing OLED display devices provided in an embodiment of the present invention.

As shown in FIGS. 11a and 11b, the mask comprises: a second mask body 30 and second vaporization openings 301 provided on the second mask body 30. Parts on the mask body 30 other than the second vaporization openings 301 comprise a plurality of blocking areas 302, each of which is of a circle or ellipse shape, and the second vaporization openings 301 are parts that are separated by the blocking areas 302.

In either a row direction or a column direction, any two adjacent ones of the blocking areas 302 are tangent to each other. The centers of circles of all of the blocking areas 302 in any row or column are in one straight line.

In this way, it is possible to vaporize the organic material light-emitting layer of the one sub-pixel 101 surrounded by the four sub-pixels 101 at corners in any one pixel unit 10 by simply using the mask and having its blocking areas 302 to be aligned, in one-to-one correspondence, with regular patterns, each of which is formed by any one of the sub-pixels 101 at a corner of a pixel unit 10 and three surrounding sub-pixels 101 in the corners of the three adjacent pixel units 10.

It is to be noted that in contrast to the above-mentioned first vaporization openings 201 of a circle or ellipse shape, in the embodiment of the present invention, the blocking areas 302 may be formed into a circle or ellipse shape by simply applying a method contrary to the above-mentioned one, thereby forming second vaporization openings 301 separated by circles or ellipses.

With the mask provided in the embodiment of the present invention, on the one hand, it reduces the difficulty of processing vaporization openings while the same resolution as the juxtaposed pixels shown in FIG. 1 is obtained, and on the other hand, it may increase resolution while the minimum accuracy achievable by vaporization openings can be guaranteed.

At least one embodiment of the present invention further provides a display device comprising the OLED display device provided in any one of the above-mentioned embodiments. The display device may be any product or component with display function such as electronic paper, an OLED panel, a cell phone, a slab computer, a TV set, a display, a notebook computer, a digital picture frame or a navigator.

What have been described above are only specific implementations of the present invention. However, the scope of the present invention is not limited thereto. Variations or substitutions that easily occur to those skilled in the art within the technical scope disclosed in the present invention should be encompassed in the scope of the present invention. Therefore, the scope of the present invention should accord with the scope of the claims.

The present application claims priority of China Patent application No. 201410324701.0 filed on Jul. 9, 2014, the content of which is incorporated in its entirety as part of the present application by reference herein.

The invention claimed is:

1. An organic light-emitting diode (OLED) display device comprising a plurality of pixel units, wherein,
    each of the pixel units comprises five sub-pixels comprising at least one red sub-pixel, at least one green sub-pixel and at least one blue sub-pixel;
    four of the five sub-pixels are distributed at four corners and have a same shape and size, one sub-pixel is surrounded by the four sub-pixels, any side of the one sub-pixel is in contact with one of the other four sub-pixels and each of the other four sub-pixels is in contact with one side of the one sub-pixel, no gap is provided between the one sub-pixel and the other four sub pixels, and the four sub-pixels have different colors from the one sub-pixel surrounded by the four sub-pixels;

any one sub-pixel at a corner of the pixel unit forms a regular pattern with one sub-pixel at a corner in each of other three adjacent pixel units, and in the regular pattern, all of the sub-pixels are of a same color and each occupies ¼ of the pattern;

the sub-pixels each comprise an anode, a cathode and a light-emitting layer of organic material; and a rectangle without any opening is formed by the four sub-pixels and the one sub-pixel, and four vertices of the one sub-pixel are on four sides of the rectangle.

2. The OLED display device according to claim 1, wherein in the four sub-pixels distributed at four corners of each pixel unit, any two opposite sub-pixels are of a same color.

3. The OLED display device according to claim 1, wherein the regular pattern is a circle shape or an ellipse shape.

4. The OLED display device according to claim 1, wherein the regular pattern is of a rhombus shape.

5. The OLED display device according to claim 1, wherein the sub-pixels further comprise thin film transistors and the thin film transistors have drain electrodes electrically connected with the anodes.

6. A method for manufacturing an organic light-emitting diode (OLED) display device, wherein the OLED display device comprises a plurality of pixel units, the method comprising:

on a substrate formed with anodes, forming organic material light-emitting layers in regions of four sub-pixels at four corners and one sub-pixel surrounded by the four sub-pixels in each of the pixel units by vaporization; and forming cathodes on the substrate formed with the organic material light-emitting layers;

wherein the four sub-pixels at four corners of the pixel unit have a same shape and size;

any side of the one sub-pixel is in contact with one of the other four sub-pixels and each of the other four sub-pixels is in contact with one side of the one sub-pixel, no gap is provided between the one sub-pixel and the other four sub pixels;

any one sub-pixel at a corner of each pixel unit forms a regular pattern with one sub-pixel at a corner in each of other three adjacent pixel units, and in the regular pattern, all of the sub-pixels are of a same color and each occupies ¼ of the pattern;

the five sub-pixels of the pixel unit comprise at least one red sub-pixel, at least one green sub-pixel and at least one blue sub-pixel, and the four sub-pixels distributed at four corners and the one sub-pixel surrounded by the four sub-pixels are of different colors; and a rectangle without any opening is formed by the four sub-pixels and the one sub-pixel, and four vertices of the one sub-pixel are on four sides of the rectangle.

7. The method according to claim 6, wherein in the four sub-pixels at four corners of the pixel unit, the organic material light-emitting layers of any two opposite sub-pixels are of a same material.

8. The method according to claim 7, wherein a first organic material light-emitting layer is vaporized by aligning a first vaporization opening of a first mask with a first sub-pixel at any corner of the pixel unit and other three sub-pixels surrounding the first sub-pixel of the pixel unit at corners; wherein the first sub-pixel is a sub-pixel at an opposite corner in the pixel unit;

a first organic material light-emitting layer is vaporized by moving the first mask to align the first vaporization opening of the first mask with a second sub-pixel at any corner of the pixel unit and other three sub-pixels surrounding the second sub-pixel of the pixel unit at corners; wherein the second sub-pixel is a sub-pixel other than the first sub-pixel at an opposite corner in the pixel unit; and a third organic material light-emitting layer is vaporized by aligning a second vaporization opening of a second mask with a third sub-pixel surrounded by the first sub-pixel and the second sub-pixel in the pixel unit.

9. The method according to claim 8, wherein the first sub-pixel, the second sub-pixel and the third sub-pixel are a red sub-pixel, a green sub-pixel and a blue sub-pixel respectively.

10. The method according to claim 8, wherein the first vaporization opening is of a circle or ellipse shape.

11. The method according to claim 8, wherein the first vaporization openings is of a rhombus shape.

12. The method according to claim 6, further comprising: forming a thin film transistor in each of the sub-pixels which has a drain electrode electrically connected with the anode.

13. A display device comprising the OLED display device of claim 1.

14. The OLED display device according to claim 2, wherein the regular pattern is a circle shape or an ellipse shape.

15. The OLED display device according to claim 2, wherein the regular pattern is of a rhombus shape.

16. The method according to claim 9, wherein the first vaporization opening is of a circle or ellipse shape.

17. The method according to claim 9, wherein the first vaporization openings is of a rhombus shape.

* * * * *